(12) United States Patent
Chen et al.

(10) Patent No.: US 7,885,079 B2
(45) Date of Patent: Feb. 8, 2011

(54) FLEXIBLE ELECTRONIC ASSEMBLY

(75) Inventors: Chun-Jung Chen, Yunlin Hsien (TW); Jian-Chiun Liou, Kaohsiung County (TW); Yu-Hung Chuang, Taipei Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 305 days.

(21) Appl. No.: 11/536,691

(22) Filed: Sep. 29, 2006

(65) Prior Publication Data

US 2008/0041617 A1 Feb. 21, 2008

(30) Foreign Application Priority Data

Aug. 18, 2006 (TW) .............................. 95130365 A

(51) Int. Cl.
*H05K 1/00* (2006.01)
(52) U.S. Cl. ....................................... 361/749; 174/254
(58) Field of Classification Search ................ 174/254, 174/262; 361/749
See application file for complete search history.

(56) References Cited

U.S. PATENT DOCUMENTS

| | | | |
|---|---|---|---|
| 5,986,217 A * | 11/1999 | Strum | ............... 174/260 |
| 6,798,052 B2 | 9/2004 | Green | |
| 2002/0114143 A1* | 8/2002 | Morrison et al. | ............. 361/749 |
| 2004/0178496 A1* | 9/2004 | Rapport et al. | ............... 257/723 |
| 2005/0088830 A1* | 4/2005 | Yumoto et al. | ............... 361/749 |
| 2005/0128717 A1* | 6/2005 | Chuang et al. | ............... 361/749 |
| 2008/0179079 A1* | 7/2008 | Ishii et al. | .................... 174/254 |

FOREIGN PATENT DOCUMENTS

| | | |
|---|---|---|
| TW | 507479 | 10/2002 |
| TW | 585016 | 4/2004 |
| TW | I237858 | 8/2005 |
| TW | 200612790 | 4/2006 |

OTHER PUBLICATIONS

"1st Office Action of Taiwan Counterpart Application", issued on Feb. 22, 2010, p. 1-p. 5.

* cited by examiner

*Primary Examiner*—Jinhee J. Lee
*Assistant Examiner*—Yuriy Semenenko
(74) *Attorney, Agent, or Firm*—Jianq Chyun IP Office

(57) ABSTRACT

A flexible electronic assembly including a flexible circuit board and at least one electronic component is provided. The flexible circuit board includes at least one dielectric film layer and at least one patterned conductive layer disposed on the dielectric film layer. The electronic component is disposed on the flexible circuit board and electrically connected to the flexible circuit board. The flexible angle of the flexible electronic assembly is greater than 5 degrees.

13 Claims, 3 Drawing Sheets

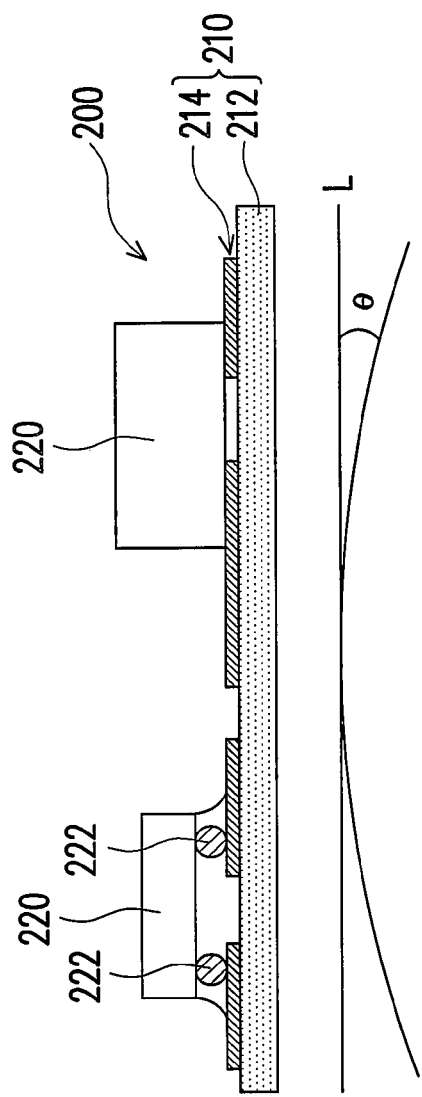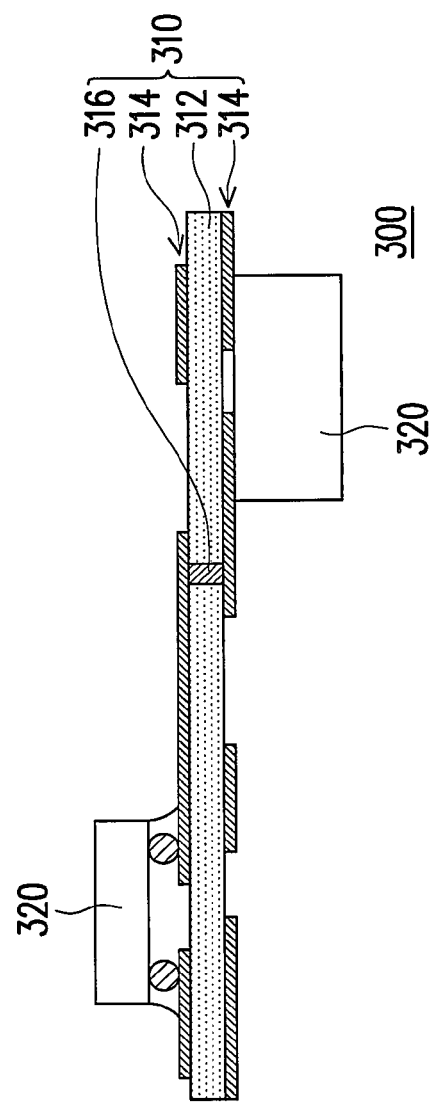

FLEXIBLE ELECTRONIC ASSEMBLY

CROSS-REFERENCE TO RELATED APPLICATION

This application claims the priority benefit of Taiwan application serial no. 95130365, filed on Aug. 18, 2006. All disclosure of the Taiwan application is incorporated herein by reference.

BACKGROUND OF THE INVENTION

1. Field of the Invention

The present invention relates to an electronic assembly. More particularly, the present invention relates to a flexible electronic assembly.

2. Description of Related Art

Generally, a conventional circuit board for carrying and electrically connecting a plurality of electronic components is composed of a plurality of patterned conductive layers and a plurality of insulating layers stacked alternately. The patterned conductive layers may be formed of copper foils through lithography and etching processes, and the insulating layers are respectively disposed between the adjacent patterned conductive layers for isolating the patterned conductive layers. Besides, these overlapped patterned conductive layers are electrically connected to each other through conductive vias. Moreover, electronic components can be disposed on the surface of the circuit board so as to form an electronic assembly. The electronic components are electrically connected to the patterned conductive layer on the surface of the circuit board and electrical signal propagation is accomplished via the internal wiring of the circuit board. However, the conventional circuit board has very low flexibility.

FIG. 1 is a diagram of another conventional flexible electronic assembly. Referring to FIG. 1, the conventional flexible electronic assembly 100 includes a glass layer 110, a plurality of electronic components 120, a plurality of flexible connectors 130, and a flexible substrate 140. The glass layer 110 has a plurality of weakened regions 112 and a plurality of islands 114. The thickness d1 of each weakened region 112 is thinner than the thickness d2 of each island 114, and the weakened regions 112 and the islands 114 are connected alternately (i.e. a weakened region 112 is connected between two adjacent islands 114), thus, a plurality of grooves 116 is formed on the top surface S1 and the bottom surface S2 of the glass layer 110.

The electronic components 120 and the flexible connectors 130 are disposed on the top surface S1 of the glass layer 110. The flexible connectors 140 are respectively disposed in the grooves 116. The electronic components 120 are disposed on the islands 114, and the electronic components 120 located on adjacent islands 114 are electrically connected to each other through one of the flexible connectors 140. In addition, the flexible substrate 140 is disposed below the bottom surface S2 of the glass layer 110. Each weakened region 112 has a slit 112a, and the flexible connectors 130 and the flexible substrate 140 are disposed on the opposite two surfaces S1 and S2 of the glass layer 110, thus, the flexible electronic assembly 100 can be curved to a particular degree. However, the curving extent of the flexible electronic assembly 100 is limited due to the glass layer 110 thereof.

SUMMARY OF THE INVENTION

The present invention is directed to a flexible electronic assembly curved to a larger curving extent.

To achieve the aforementioned and other objectives, a flexible electronic assembly of the present invention including a flexible circuit board and at least one electronic component is provided. The flexible circuit board includes at least one dielectric film layer and at least one patterned conductive layer disposed on the dielectric film layer. The electronic component is disposed on the flexible circuit board and electrically connected to the flexible circuit board, and a flexible angle of the flexible electronic assembly is greater than 5 degrees.

In an embodiment of the present invention, the material of the dielectric film layer may be polyimide, glass epoxy resin, polyester, or bismaleimide-triazine resin.

In an embodiment of the present invention, the electronic component comprising at least one logic control component, at least one driving component, at least one light emitting diode, or at least one photodiode.

In an embodiment of the present invention, there may be two patterned conductive layers and one dielectric film, and the patterned conductive layers may be respectively disposed on two opposite surfaces of the dielectric film layer. Besides, the flexible circuit board further includes at least one conductive via passing through the dielectric film layer, and the patterned conductive layers are electrically connected through the conductive via. Furthermore, a plurality of electronic components may be disposed on the patterned conductive layers.

In an embodiment of the present invention, there may be three patterned conductive layers and two dielectric film layers, wherein each dielectric film layer may be disposed between two adjacent patterned conductive layers. Besides, the flexible circuit board further includes at least one conductive via passing through at least one dielectric film layer, and at least two patterned conductive layers are electrically connected through the conductive via. Furthermore, a plurality of electronic components may be disposed on the outmost patterned conductive layers.

In an embodiment of the present invention, the electronic component may have a plurality of bumps, and the electronic component may be electrically connected to the flexible circuit board through the bumps. The material of the bumps include tin, lead, tin-lead alloy, or gold.

As described above, the flexible angle of the flexible electronic assembly of the present invention is greater than 5 degrees, thus, the flexible electronic assembly of the present invention can be curved to a larger curving extent such that the flexible electronic assembly can be placed into the limited space of an electronic apparatus (such as a cell phone).

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2 is a diagram of a flexible electronic assembly according to a first embodiment of the present invention.

FIG. 3 is a diagram of a flexible electronic assembly according to a second embodiment of the present invention.

DESCRIPTION OF EMBODIMENTS

Figure 1:
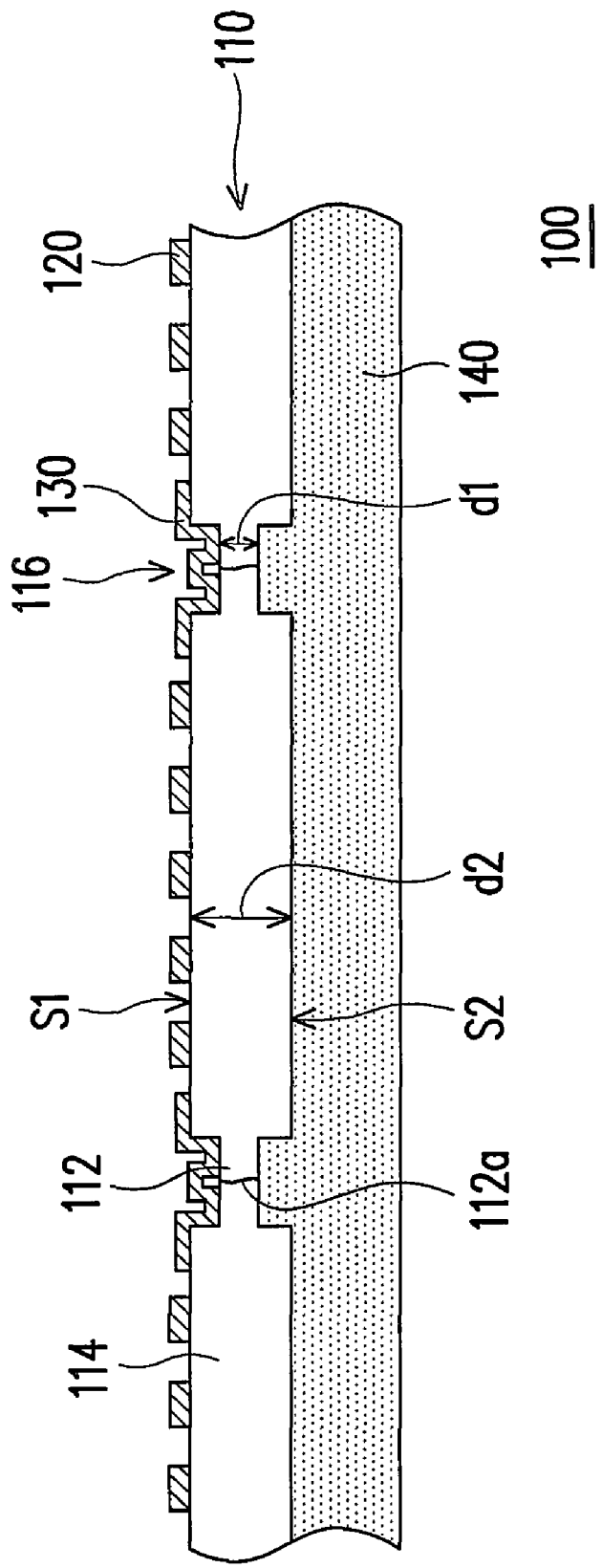
FIG. 1 is a diagram of a conventional flexible electronic assembly.

FIG. 2 is a diagram of a flexible electronic assembly according to a first embodiment of the present invention. Referring to FIG. 2, the flexible electronic assembly 200 includes a flexible circuit board 210 and at least one electronic component 220 (two are illustrated in FIG. 2 demonstratively). The flexible circuit board 210 includes a dielectric film layer 212 and a patterned conductive layer 214 disposed on the dielectric film layer 212. The electronic components 220 are disposed on the flexible circuit board 210 and electrically connected to the flexible circuit board 210, and the flexible angle θ of the flexible electronic assembly 200 is greater than 5 degrees. It should be noted that the flexible angle θ refers to the tangent angle formed by the curved flexible circuit board 210 with a horizontal line L tangent to the curved flexible circuit board 210. Besides, the value of the flexible angle θ of the flexible electronic assembly 200 is determined according to the material of the flexible circuit board 210 and the sizes of the electronic components 220 thereon. For example, the smaller the sizes of the electronic components 220 are, the larger the curving extent of the flexible electronic assembly is.

In the first embodiment, the material of the dielectric film layer 212 may be polyimide, glass epoxy resin, polyester, or bismaleimide-triazine resin (i.e. BT resin), and the electronic components 220 may be disposed on the patterned conductive layer 214. Besides, one of the electronic components 220 may be a logic control component or a driving component. The electronic component 220 may be a chip or a chip package. The other one of the electronic components 220 may be a light emitting diode chip, a chip having photodiode, or a chip package containing one of the foregoing chips.

In specific, the electronic components 220 may be radio frequency identification (RFID) electronic components such as RFID tags, contact less ID tags, RFID transponders, etc. The diameter of a chip of a RFID electronic component is only about 2 cm. A RFID electronic component can be assembled with an antenna as a module and then the module can be constructed into card or coin shape according to the application requirement. A RFID electronic component requires a read/write device to be read or written, and the chip thereof can be adhered on the flexible circuit board 210 and carried in hand to pass through a security gate. In addition, the electronic components 220 may be electronic components applicable to a cell phone, such as heterojunction bipolar transistors (HBT) or high frequency integrated circuit components.

The electronic components 220 can be electrically connected to the patterned conductive layer 214 through flip chip bonding technology, tape automated bonding technology, or surface mounting technology. For example, one of the electronic components 220 may be a chip and has a plurality of bumps 222, and the said electronic component 220 is electrically connected to the patterned conductive layer 214 through the bumps 222. The said electronic component 220 is usually electrically connected to the patterned conductive layer 214 through flip chip bonding technology if the material of the bumps 222 of the said electronic component 220 is tin, lead, or tin-lead alloy, while the said electronic component 220 is usually electrically connected to the patterned conductive layer 214 through tape automated bonding technology if the material of the bumps 222 is gold.

Furthermore, if one of the electronic components 220 is a chip package, the said electronic component 220 can be electrically connected to the patterned conductive layer 214 through solder paste (not shown). In other words, the said electronic component 220 is electrically connected to the patterned conductive layer 214 through surface mounting technology. It should be noted that the electronic components 220 (of enough number) of the flexible electronic assembly 200 may be electrically connected to the flexible circuit board 210 through any one, two, or three of the aforementioned technologies.

FIG. 3 is a diagram of a flexible electronic assembly according to the second embodiment of the present invention. Referring to FIG. 3, the difference of the flexible electronic assembly 300 in the second embodiment from the flexible electronic assembly 200 in the first embodiment is that the flexible circuit board 310 of the flexible electronic assembly 300 may contain two patterned conductive layers 314 which are respectively disposed on two opposite surfaces of the dielectric film layer 312. Besides, the flexible circuit board 310 further includes at least one conductive via 316 (one is illustrated in FIG. 3 demonstratively) passing through the dielectric film layer 312 and the patterned conductive layers 314 are electrically connected through the conductive via 316. In addition, the electronic components 320 are respectively disposed on the patterned conductive layers 314.

It should be noted that the patterned conductive layers 314 may be formed of copper foils (not shown) through lithography and etching processes, thus, each of the patterned conductive layers 314 has a wiring pattern. However, the wiring patterns of the patterned conductive layers 314 may be different from each other.

Figure 4:
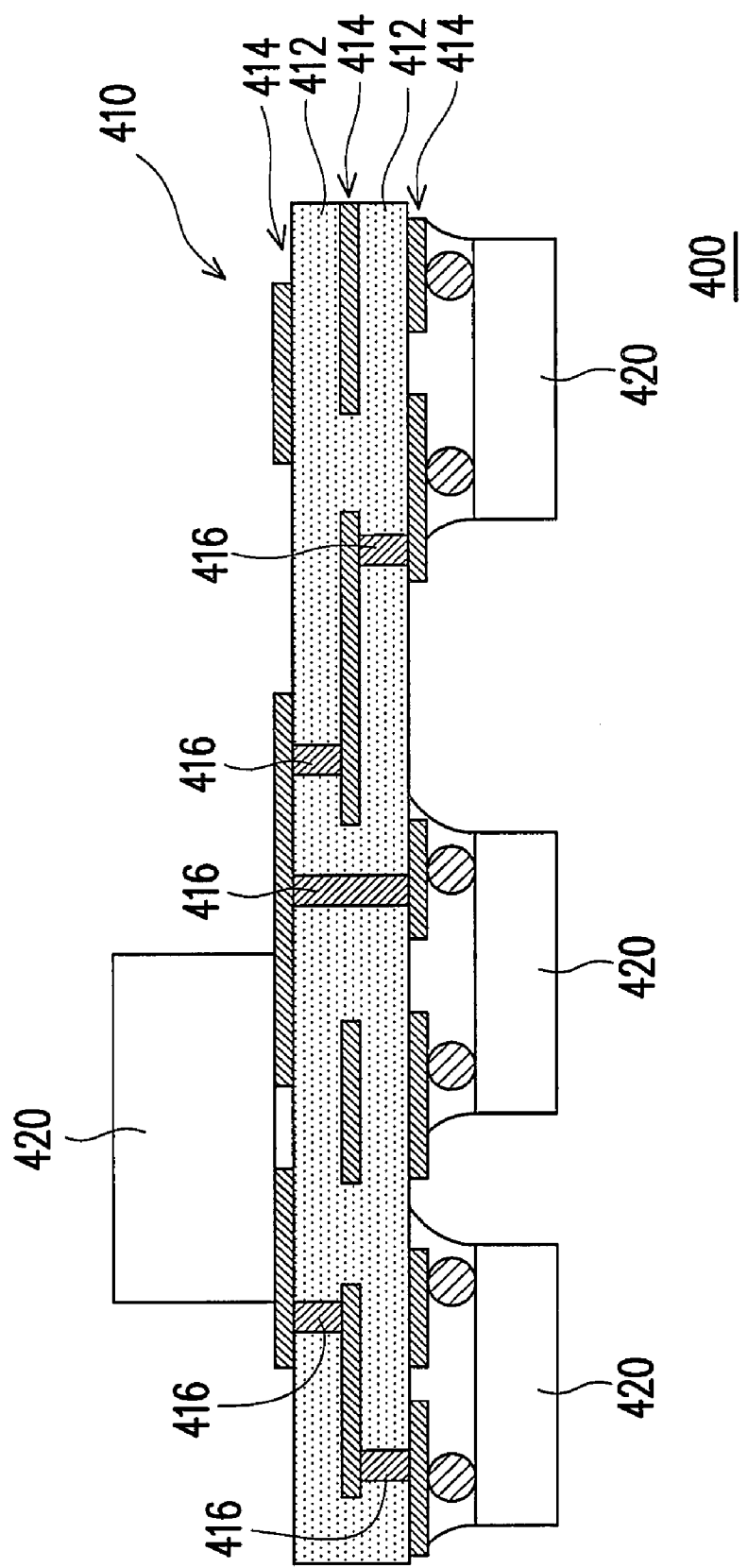
FIG. 4 is a diagram of a flexible electronic assembly according to a third embodiment of the present invention.

FIG. 4 is a diagram of a flexible electronic assembly according to the third embodiment of the present invention. Referring to FIG. 4, the difference of the flexible electronic assembly 400 in the third embodiment from the flexible electronic assemblies 200 and 300 in foregoing embodiments is that the flexible circuit board 410 of the flexible electronic assembly 400 may have three patterned conductive layers 414 and two dielectric film layers 412, and each dielectric film layer 412 may be disposed between two adjacent patterned conductive layers 414. Besides, the flexible circuit board 410 further includes a plurality of conductive vias 416. One of the conductive vias 416 may pass through the dielectric film layers 412, and the patterned conductive layers 414 are electrically connected through the conductive vias 416. In addition, the electronic components 420 are disposed on the outmost patterned conductive layers 414.

Moreover, regarding the relative position as illustrated in FIG. 4, the electronic component 420 located on the top patterned conductive layer 414 may be a logic control component which is electrically connected to a plurality of electronic components 420 (for example, light emitting diode chips) on the bottom patterned conductive layer 414 through the patterned conductive layers 414 and the conductive vias 416. Only three electronic components 420 on the bottom patterned conductive layer 414 are demonstratively illustrated in FIG. 4, however, the present embodiment is not limited thereto. In the present embodiment, the electronic component 420 on the top patterned conductive layer 414 can directly control the electronic components 420 on the bottom patterned conductive layer 414, which means, the electronic component 420 on the top patterned conductive layer 414 is multi-functional.

In summary, the flexible angle of the flexible electronic assembly in the present invention is greater than 5 degrees, thus, the curving extent of the flexible electronic assembly in the present invention is larger such that the flexible electronic assembly can be placed in the limited space of an electronic apparatus. The aforementioned electronic apparatus may be a cell phone, a display, a flexible poster, a vehicle dashboard, a personal digital assistant (PDA), a RFID system, a sensor, an electronic book, or solar wallpaper.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flexible electronic assembly, comprising:
   a flexible circuit board, comprising:
   at least one dielectric film layer; and
   at least one patterned conductive layer, disposed on the dielectric film layer; and
   a plurality of electronic components, disposed on a flexible region of the flexible circuit board and electrically connected to the flexible circuit board through the patterned conductive layer, wherein at least a part of the patterned conductive layer is not covered by the electronic component and is exposed, a flexible angle of the flexible electronic assembly is greater than 5 degrees, and the electronic components are operated independently without any conductive layer connected therebetween.

2. The flexible electronic assembly as claimed in claim 1, wherein a material of the dielectric film layer includes polyimide, glass epoxy resin, polyester, or bismaleimide-triazine resin.

3. The flexible electronic assembly as claimed in claim 1, wherein at least one of the electronic components comprises a logic control component or a driving component.

4. The flexible electronic assembly as claimed in claim 1, wherein at least one of the electronic components comprises a light emitting diode, a photodiode, a radio frequency identification (RFID) electronic component, a heterojunction bipolar transistor (HBT), or a high frequency integrated circuit component.

5. The flexible electronic assembly as claimed in claim 1, wherein a number of the patterned conductive layers is two, a number of the dielectric film layer is one, and the patterned conductive layers are respectively disposed on two opposite surfaces of the dielectric film layer.

6. The flexible electronic assembly as claimed in claim 5, wherein the flexible circuit board further comprises at least one conductive via passing through the dielectric film layer, and the patterned conductive layers are electrically connected through the conductive via.

7. The flexible electronic assembly as claimed in claim 5, wherein a number of the electronic components is more than one, and the electronic components are disposed on the patterned conductive layers.

8. The flexible electronic assembly as claimed in claim 1, wherein a number of the patterned conductive layers is three, a number of the dielectric film layers is two, and each of the dielectric film layers is disposed between two adjacent patterned conductive layers.

9. The flexible electronic assembly as claimed in claim 8, wherein the flexible circuit board further comprises at least one conductive via passing through the at least one dielectric film layer, and at least two of the patterned conductive layers are electrically connected through the conductive via.

10. The flexible electronic assembly as claimed in claim 8, wherein a number of the electronic components is more than one, and the electronic components are disposed on the outmost patterned conductive layers.

11. The flexible electronic assembly as claimed in claim 1, wherein at least one of the electronic components has a plurality of bumps, and at least one of the electronic components is electrically connected to the flexible circuit board through the bumps.

12. The flexible electronic assembly as claimed in claim 11, wherein a material of the bumps comprises tin, lead, or tin-lead alloy.

13. The flexible electronic assembly as claimed in claim 11, wherein a material of the bumps includes gold.

* * * * *